(12) United States Patent
Lee

(10) Patent No.: US 7,986,174 B2
(45) Date of Patent: Jul. 26, 2011

(54) OUTPUT DRIVER CIRCUIT

(75) Inventor: Sang Kwon Lee, Yongin-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/844,175

(22) Filed: Jul. 27, 2010

(65) Prior Publication Data

US 2011/0050290 A1    Mar. 3, 2011

(30) Foreign Application Priority Data

Aug. 28, 2009    (KR) .......................... 10-2009-0080736

(51) Int. Cl.
*H03K 3/00* (2006.01)

(52) U.S. Cl. ............................ 327/108; 327/170; 326/87

(58) Field of Classification Search .................. None
See application file for complete search history.

(56) References Cited

U.S. PATENT DOCUMENTS

| 7,714,618 | B2 | 5/2010 | Chen |
| 2009/0168549 | A1* | 7/2009 | Jeon .............................. 327/108 |

FOREIGN PATENT DOCUMENTS

KR       100808598 B1    2/2008

* cited by examiner

*Primary Examiner* — An T Luu

(57) ABSTRACT

An output driver circuit includes a pre-driver unit and a first driving unit. The pre-driver unit is configured to generate a driving selection signal and a driving signal from a pre-driving signal in response to a group selection signal and a code signal. The first driving unit is configured to drive a data pad in response to the driving selection signal and the driving signal.

22 Claims, 7 Drawing Sheets

OUTPUT DRIVER CIRCUIT

CROSS-REFERENCES TO RELATED APPLICATIONS

The present application claims priority under 35 U.S.C 119(a) to Korean application number 10-2009-0080736, filed on Aug. 28, 2009, in the Korean Intellectual Property Office, which is incorporated herein by reference in its entirety.

BACKGROUND

In general, an output driver circuit of a semiconductor memory device is used to output an internal data to the outside of a chip through an output terminal, that is, a data pad. The output driver circuit receives the internal data and drives the data pad with a set driving strength.

FIG. 1 is a circuit diagram of an output data driving unit included in a conventional output driver circuit.

As illustrated in FIG. 1, the output data driving unit included in the conventional output driver circuit receives a pull-up driving signal PUB and a pull-down driving signal PD, which are generated by pre-decoding an internal data, and drives a data pad DQ. At this time, driving strength which drives the data pad DQ is determined by pull-up codes PCALB<1:4> and pull-down codes NCALB<1:4>. The pull-up codes PCALB<1:4> and the pull-down codes NCALB<1:4> are generated by a ZQ calibration circuit.

The ZQ calibration circuit is a circuit that counts the pull-up codes PCALB<1:4> and the pull-down codes NCALB<1:4> by using an external resistor ZQ having a constant resistance, regardless of variations in process, voltage and temperature (PVT) characteristics, in order to drive the data pad DQ with a constant driving strength even though the PVT characteristics are varied. That is, the ZQ calibration circuit up-counts the pull-up codes PCALB<1:4> and the pull-down codes NCALB<1:4> when it is necessary to increase the driving strength which drives the data pad DQ, depending on the variations in the PVT characteristics. On the other hand, the ZQ calibration circuit down-counts the pull-up codes PCALB<1:4> and the pull-down codes NCALB<1:4> when it is necessary to decrease the driving strength, depending on the variations in the PVT characteristics.

In the conventional output data driving unit, PMOS transistors P11, P12, P13, P14 receiving the pull-up driving signal PUB are coupled in series to PMOS transistors P15, P16, P17, P18 receiving the pull-up codes PCALB<1:4>, respectively. Also, NMOS transistors N11, N12, N13, N14 receiving the pull-down driving signal PD are coupled in series to NMOS transistors N15, N16, N17, N18 receiving the pull-down codes NCALB<1:4>, respectively. As such, in a case where the output data driving unit is configured with two or more MOS transistors coupled in series, the operating speed and the driving strength are greatly reduced, as compared to a case where the output data driving unit is configured with single MOS transistors. Thus, sizes of the MOS transistors must be increased in order to ensure the same operating speed and driving strength. Consequently, the conventional output data driving unit must use large-sized MOS transistors, resulting in the increase in the circuit area and current consumption.

SUMMARY

An embodiment of the present invention relates to an output driver circuit which drives a data pad by using single MOS transistors, thereby reducing a circuit area and current consumption and improving an operating speed.

In one embodiment, an output driver circuit includes: a pre-driver unit configured to generate a driving selection signal and a driving signal from a pre-driving signal in response to a group selection signal and a code signal; and a first driving unit configured to drive a data pad in response to the driving selection signal and the driving signal.

In another embodiment, an output driver circuit includes: a first pre-driver configured to generate a driving selection signal from a pre-driving signal in response to a group selection signal; a second pre-driver configured to generate a first driving signal of a first group from the pre-driving signal in response to the group selection signal and a first code signal; a third pre-driver configured to generate a second driving signal of the first group from the pre-driving signal in response to the group selection signal and a second code signal; and a driving unit configured to drive a data pad in response to the driving selection signal and the first and second driving signals of the first group.

In another embodiment, an output driver circuit includes: a first pre-driver unit configured to generate a first driving selection signal and a first driving signal of a first group from a pre-driving signal in response to a first group selection signal and a first code signal; first and second driving units configured to drive a data pad in response to the first driving selection signal and the first driving signal of the first group; a second pre-driver unit configured to generate a second driving selection signal and first and second driving signals of a second group from the pre-driving signal in response to a second group selection signal and first and second code signals; and a third driving unit configured to drive the data pad in response to the first driving selection signal and the first and second driving signals of the second group.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
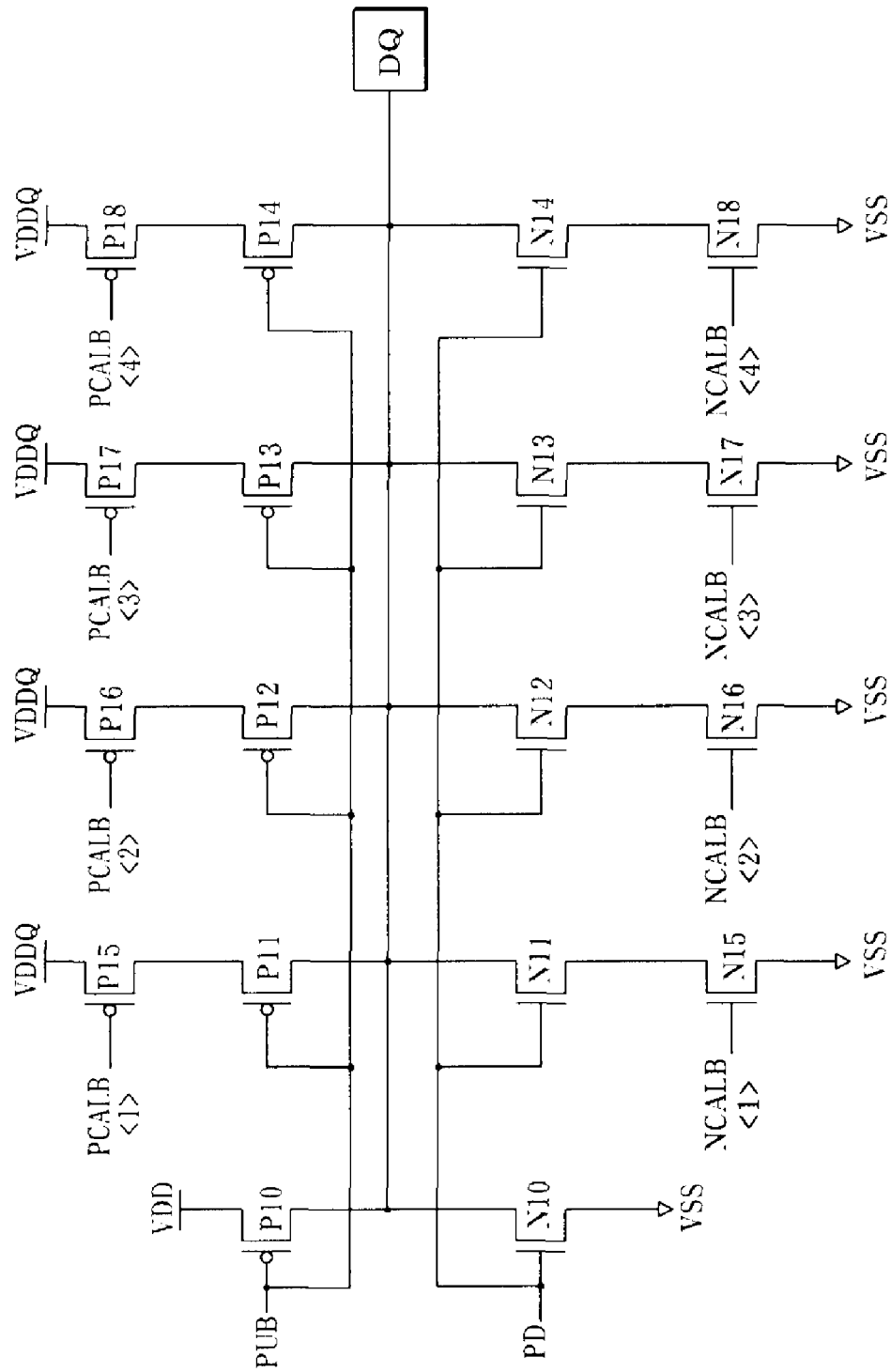
FIG. 1 is a circuit diagram of an output data driving unit included in a conventional output driver circuit.
Figure 2:
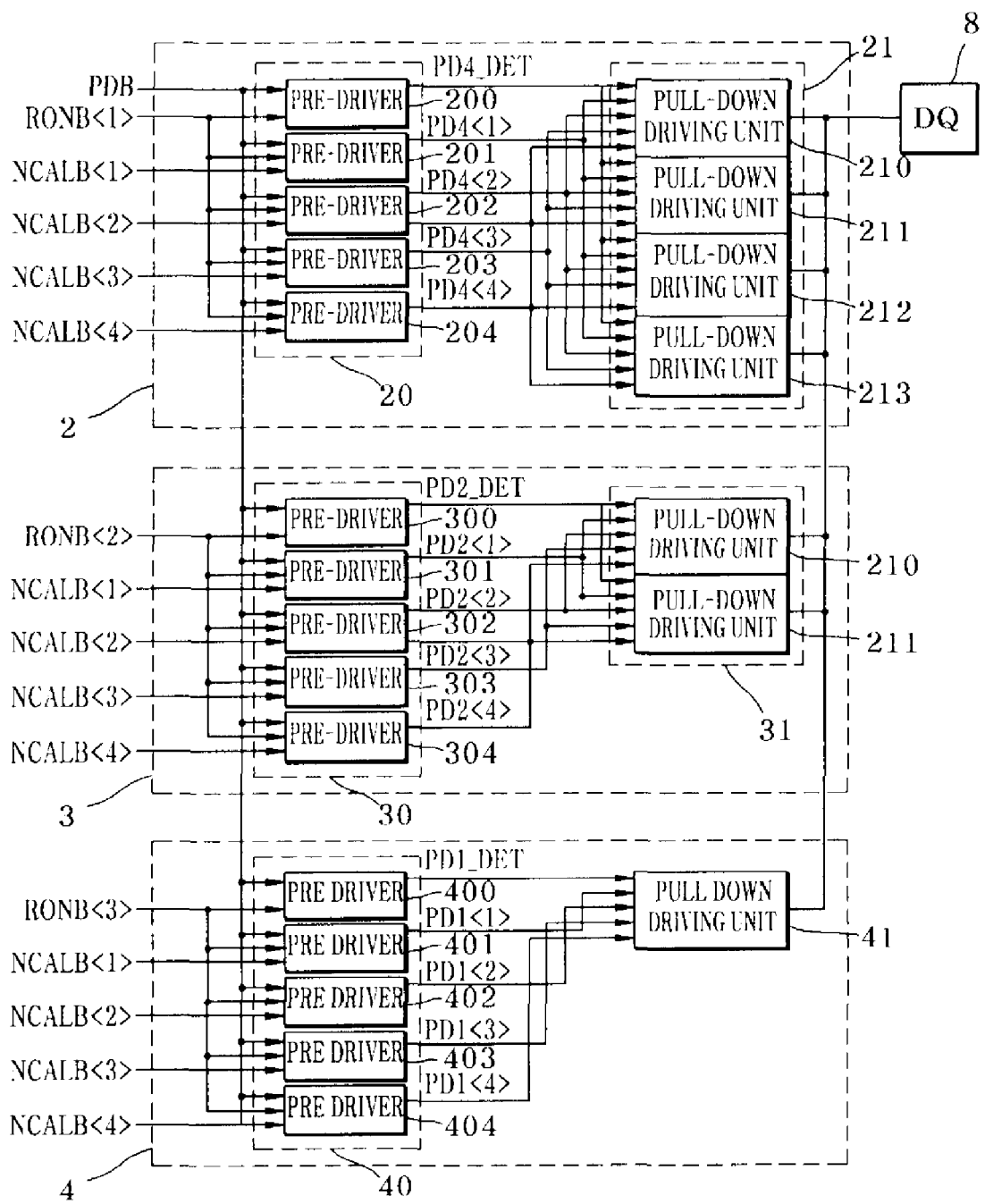
FIG. 2 is a configuration diagram of a pull-down driver circuit included in an output driver circuit according to an embodiment of the present invention.
Figure 6:
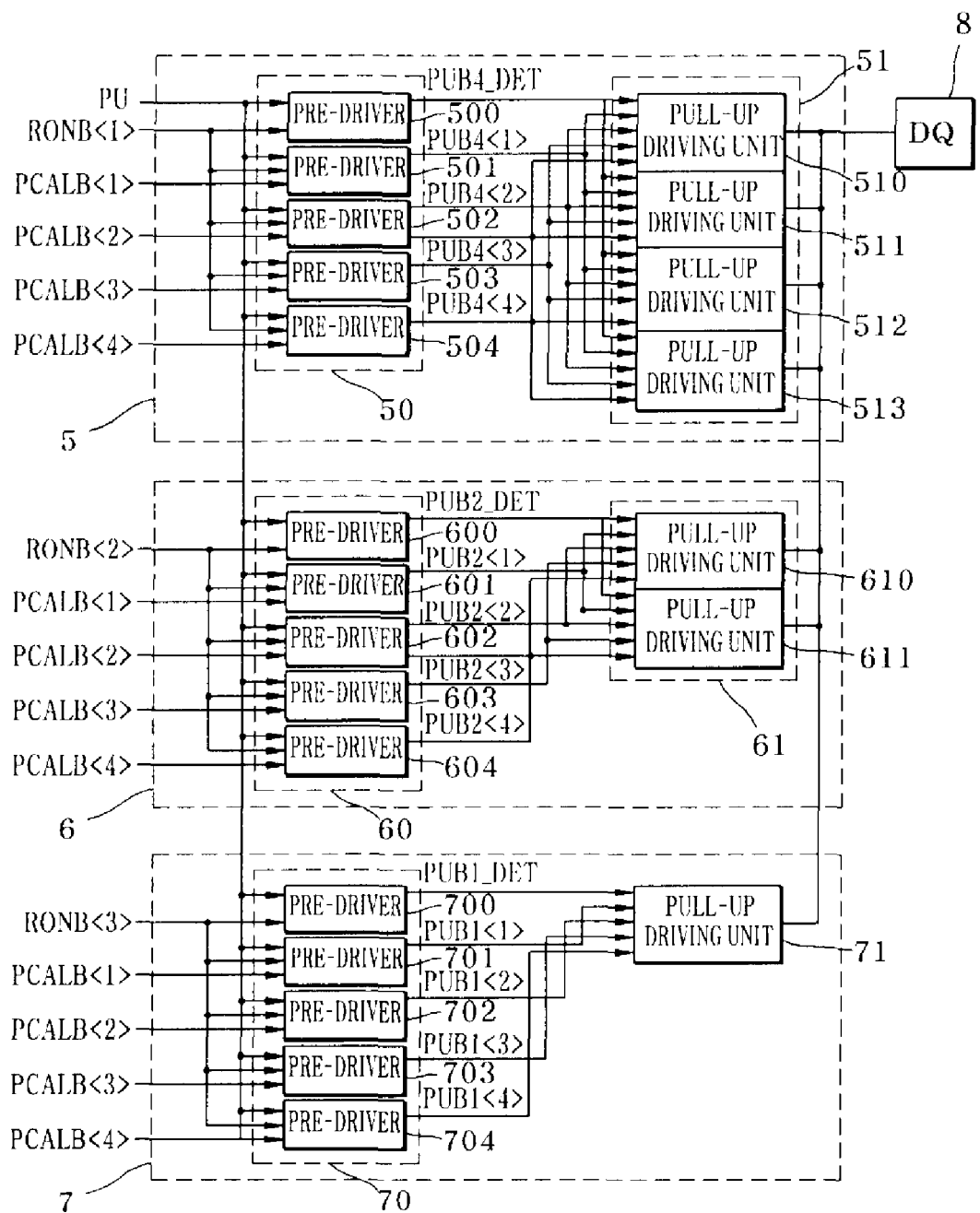
FIG. 6 is a configuration diagram of a pull-up driver circuit included in the output driver circuit according to an embodiment of the present invention.

FIGS. 2 and 6 are configuration diagrams of an output driver circuit according to an embodiment of the present invention. More specifically, FIG. 2 is a configuration diagram of a pull-down driver circuit included in the output driver circuit according to an embodiment of the present invention, and FIG. 6 is a configuration diagram of a pull-up driver circuit included in the output driver circuit according to an embodiment of the present invention.

As illustrated in FIG. 2, the pull-down driver circuit included in the output driver circuit includes a first group pull-down block 2, a second group pull-down block 3, and a third group pull-down block 4. The first group pull-down block 2 includes a first pre-driver unit 20 configured with first, second, third, fourth, and fifth pre-drivers 200, 201, 202, 203, and 204, respectively, of a first group, and a first output driving unit 21 configured with first second, third, and fourth pull-down driving units 210, 211, 212, and 213, respectively, of the first group. The second group pull-down block 3 includes a second pre-driver unit 30 configured with first, second, third, fourth, and fifth pre-drivers 300, 301, 302, 303, and 304, respectively, of a second group, and a second output driving unit 31 configured with first and second pull-down driving units 310 and 311, respectively, of the second group. The third group pull-down block 4 includes a third pre-driver unit 40 configured with first, second, third, fourth, and fifth pre-drivers 400, 401, 402, and 404, respectively, of a third group, and a pull-down driving unit 41 of the third group.

Figure 3:
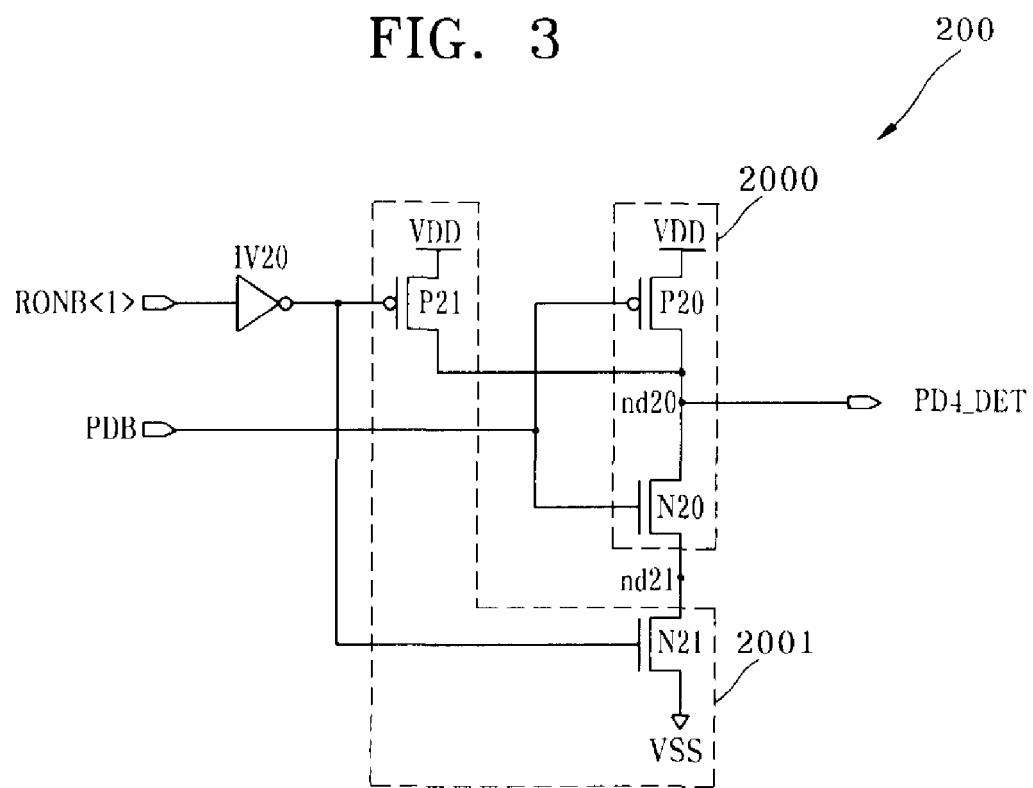
FIGS. 3 and 4 are circuit diagrams of pre-drivers included in the pull-down driver circuit of FIG. 2.

As illustrated in FIG. 3, the first pre-driver 200 of the first group includes a buffer 2000 and a driving controller 2001. Specifically, the buffer 2000 includes a PMOS transistor P20 and an NMOS transistor N20. The PMOS transistor P20 is coupled between a power supply voltage terminal VDD and a node nd20, and configured to pull up the node nd20 in response to a pre-pull-down driving signal PDB. The NMOS transistor N20 is coupled between the node nd20 and a node nd21, and configured to pull down the node nd20 in response to the pre-pull-down driving signal PDB. The buffer 2000 buffers the pre-pull-down driving signal PDB and generates a first pull-down driving selection signal PD4_DET. The driving controller 2001 includes a PMOS transistor P21 and an NMOS transistor N21 which are configured to drive the buffer 2000 when a first group selection signal RONB<1> having a low level is input thereto. The pre-pull-down driving signal PDB is a signal which is enabled to a low level when data output from a memory cell in a read operation has a low level, and the first group selection signal RONB<1> is a signal which is input from the outside or generated internally in order to drive the first group pull-down block 2. The configurations of the first pre-driver 300 of the second group and the first pre-driver 400 of the third group are substantially identical to that of the first pre-driver 200 of the first group, except for input/output signals.

Figure 4:
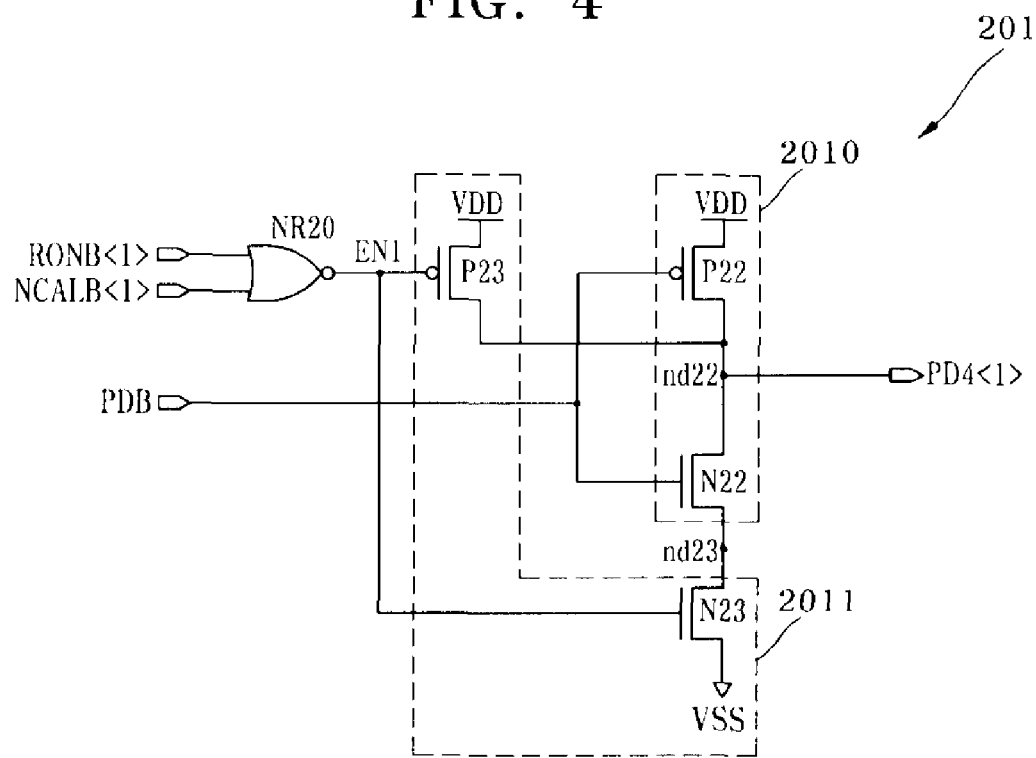

As illustrated in FIG. 4, the second pre-driver 201 of the first group includes a buffer 2010, a NOR gate NR20, and a driving controller 2011. Specifically, the buffer 2010 includes a PMOS transistor P22 and an NMOS transistor N22. The PMOS transistor P22 is coupled between the power supply voltage terminal VDD and a node nd22, and configured to pull up the node nd22 in response to the pre-pull-down driving signal PDB. The NMOS transistor N22 is coupled between the node nd22 and a node nd23, and configured to pull down the node nd22 in response to the pre-pull-down driving signal PDB. The buffer 2010 buffers the pre-pull-down driving signal PDB and generates a first pull-down driving signal PD4<1> of the first group. The NOR gate NR20 is configured to generate a first enable signal EN1 which is enabled to a high level when both of the first group selection signal RONB<1> and the first pull-down code NCALB<1> are enabled to a low level. The driving controller 2011 includes a PMOS transistor P23 and an NMOS transistor N23 which are configured to drive the buffer 2010 when the first enable signal EN1 enabled to a high level is input thereto. At this time, the first pull-down code NCALB<1> is a signal whose enabling is determined by a counting operation which is performed by an external resistor (ZQ) in a ZQ calibration circuit. The configurations of the third to fifth pre-drivers 202, 203, 204 of the first group, the second to fifth pre-drivers 301, 302, 303, 304 of the second group, and the second to fifth pre-drivers 401, 402, 403, 404 of the third group are substantially identical to that of the second pre-driver 201 of the first group, except for input/output signals.

Figure 5:
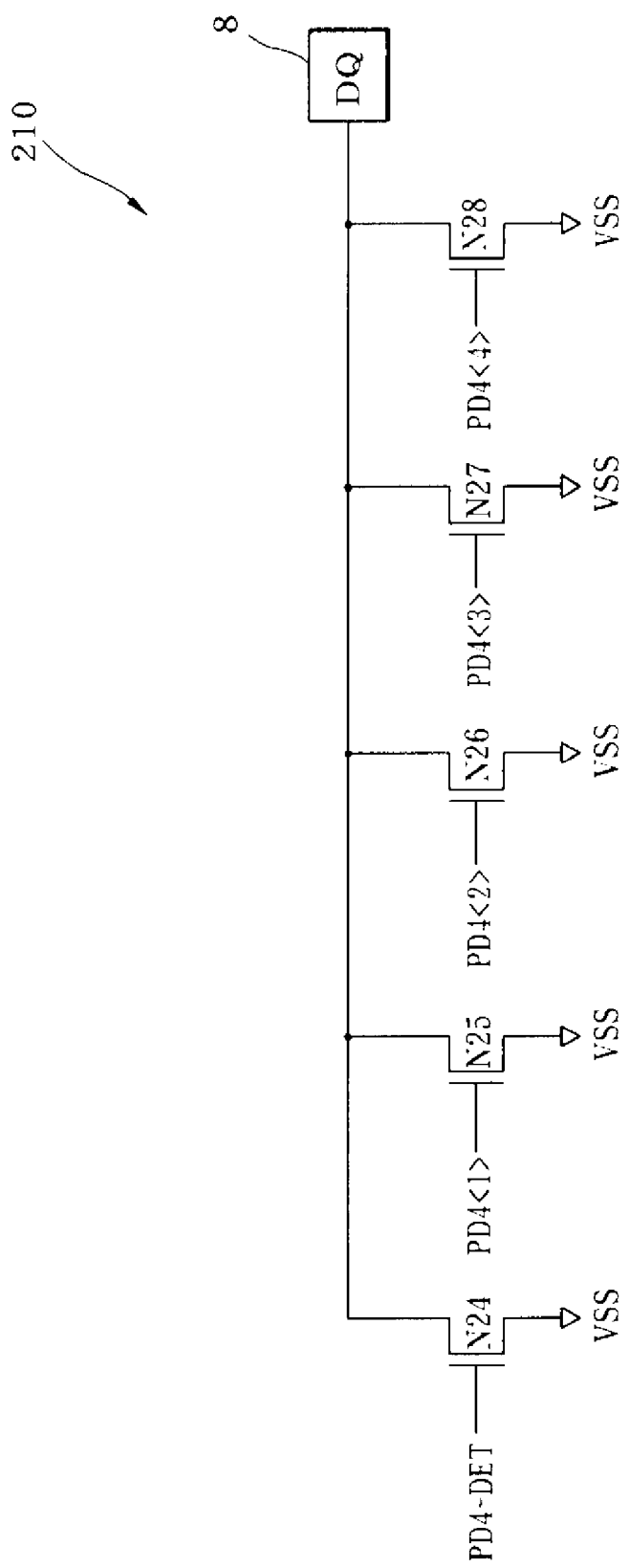
FIG. 5 is a circuit diagram of a pull-down driving unit included in the pull-down driver circuit of FIG. 2.

As illustrated in FIG. 5, the first pull-down driving unit 210 of the first group includes NMOS transistors N24, N25, N26, N27, N28. The NMOS transistor N24 is configured to be turned on in response to the first pull-down driving selection signal PD4_DET and pull down the data pad 8. The NMOS transistors N25, N26, N27, N28 are configured to be turned on in response to the first to fourth pull-down driving signals PD4<1:4> of the first group and pull down the data pad 8. The configurations of the second to fourth pull-down driving units 211, 212, 213 of the first group, the first and second pull-down driving units 310 and 311 of the second group, and the pull-down driving unit 41 of the third group are substantially identical to that of the first pull-down driving unit 210 of the first group.

The pull-down driver circuit included in the output driver circuit according to an embodiment of the present invention has a structural feature in that the first to fourth pull-down codes NCALB<1:4> generated from the ZQ calibration circuit are input to the first pre-driver unit 20, the second pre-driver unit 30, and the third pre-driver unit 40. Therefore, as illustrated in FIG. 5, the first to fourth pull-down driving units 210, 211, 212, 213 of the first group, the first and second pull-down driving units 310 and 311 of the second group, and the pull-down driving unit 41 of the third group are implemented with single MOS transistors which are not coupled in series, thereby reducing the circuit area and current consumption. Furthermore, the pull-down driver circuit included in the output driver circuit is provided with groups including pull-down driving units which share the plurality of pre-drivers, thereby reducing the circuit area.

As illustrated in FIG. 6, the pull-up driver circuit included in the output driver circuit according to the embodiment of an present invention includes a first group pull-up block 5, a second group pull-up block 6, and a third group pull-up block 7. The first group pull-up block 5 includes a fourth pre-driver unit 50 configured with first, second, third, fourth, and fifth pre-drivers 500, 501, 502, 503, and 504, respectively, of a fourth group, and a fourth output driving unit 51 configured with first, second, third, and fourth pull-up driving units 510, 511, 512, and 513, respectively, of the fourth group. The second group pull-up block 6 includes a fifth pre-driver unit 60 configured with first, second, third, fourth, and fifth pre-drivers 600, 601, 602, 603, and 604, respectively, of a fifth group, and a fifth output driving unit 61 configured with first and second pull-up driving units 610 and 611, respectively, of the fifth group. The third group pull-up block 7 includes a sixth pre-driver unit 70 configured with first, second, third, fourth, and fifth pre-drivers 700, 701, 702, 703, and 704, respectively, of a sixth group, and a pull-up driving unit 71 of the sixth group.

Figure 7:
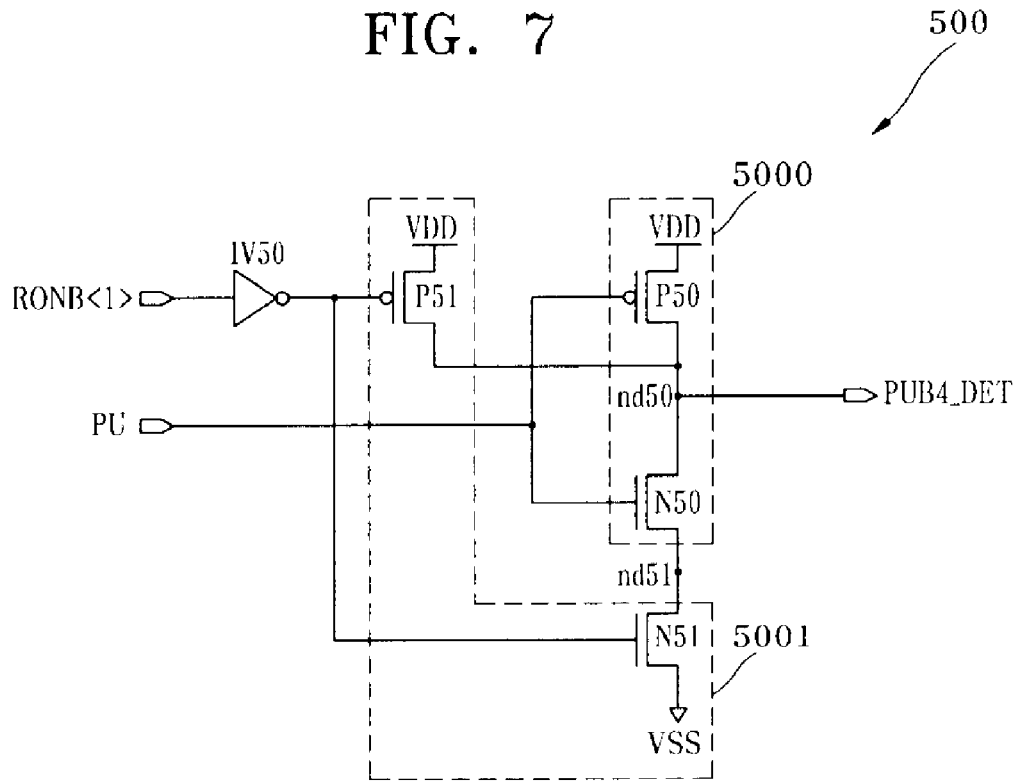
FIGS. 7 and 8 are circuit diagrams of pre-drivers included in the pull-up driver circuit of FIG. 6.

As illustrated in FIG. 7, the first pre-driver 500 of the fourth group includes a buffer 5000 and a driving controller 5001. Specifically, the buffer 5000 includes a PMOS transistor P50 and an NMOS transistor N50. The PMOS transistor P50 is coupled between the power supply voltage terminal VDD and a node nd50, and configured to pull up the node nd50 in response to a pre-pull-up driving signal PU. The NMOS transistor N50 is coupled between the node nd50 and a node nd51, and configured to pull down the node nd50 in response to the pre-pull-up driving signal PU. The buffer 5000 buffers the pre-pull-up driving signal PU and generates a first pull-up driving selection signal PUB4_DET. The driving controller 5001 includes a PMOS transistor P51 and an NMOS transistor N51 which are configured to drive the buffer 5000 when the first group selection signal RONB<1> having a low level is input thereto. The pre-pull-up driving signal PU is a signal which is enabled to a high level when data output from a memory cell in a read operation has a high level, and the first group selection signal RONB<1> is a signal which is input from the outside (or generated internally) in order to drive the first group pull-up block 5. The configurations of the first pre-driver 600 of the fifth group and the first pre-driver 700 of the sixth group are substantially identical to that of the first pre-driver 500 of the fourth group, except for input/output signals.

Figure 8:
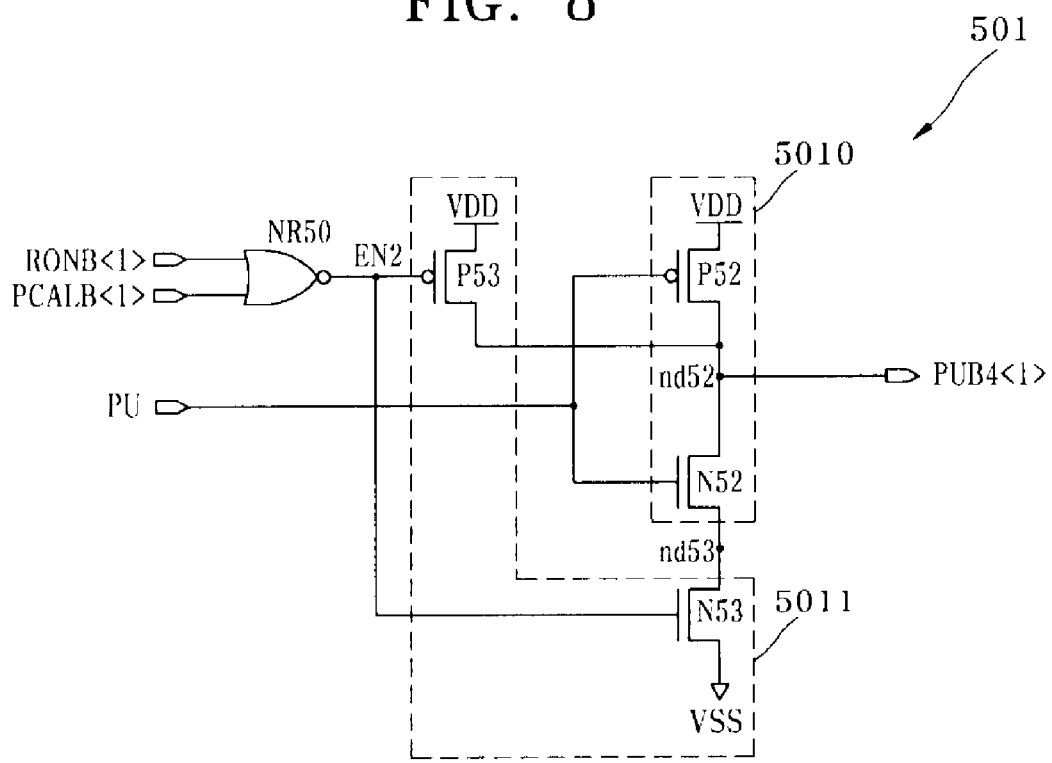

As illustrated in FIG. 8, the second pre-driver 501 of the fourth group includes a buffer 5010, a NOR gate NR50, and a driving controller 5011. Specifically, the buffer 5010 includes a PMOS transistor P52 and an NMOS transistor N52. The PMOS transistor P52 is coupled between the power supply voltage terminal VDD and a node nd52, and configured to pull up the node nd52 in response to the pre-pull-up driving signal PU. The NMOS transistor N52 is coupled between the node nd52 and a node nd53, and configured to pull down the node nd52 in response to the pre-pull-up driving signal PU. The buffer 5010 buffers the pre-pull-up driving signal PU and generates a first pull-up driving signal PUB4<1> of the fourth group. The NOR gate NR50 is configured to generate a second enable signal EN2 which is enabled to a high level when both of the first group selection signal RONB<1> and the first pull-up code PCALB<1> are enabled to a low level. The driving controller 5011 includes a PMOS transistor P53 and an NMOS transistor N53 which are configured to drive the buffer 5010 when the second enable signal EN2 enabled to a high level is input thereto. At this time, the first pull-up code PCALB<1> is a signal, which is enabled based on a counting operation which is performed by an external resistor (ZQ) in a ZQ calibration circuit. The configurations of the third to fifth pre-drivers 502, 503, 504 of the fourth group, the second to fifth pre-drivers 601, 602, 603, 604 of the fifth group, and the second to fifth pre-drivers 701, 702, 703, 704 of the sixth group are substantially identical to that of the second pre-driver 501 of the fourth group, except for input/output signals.

Figure 9:
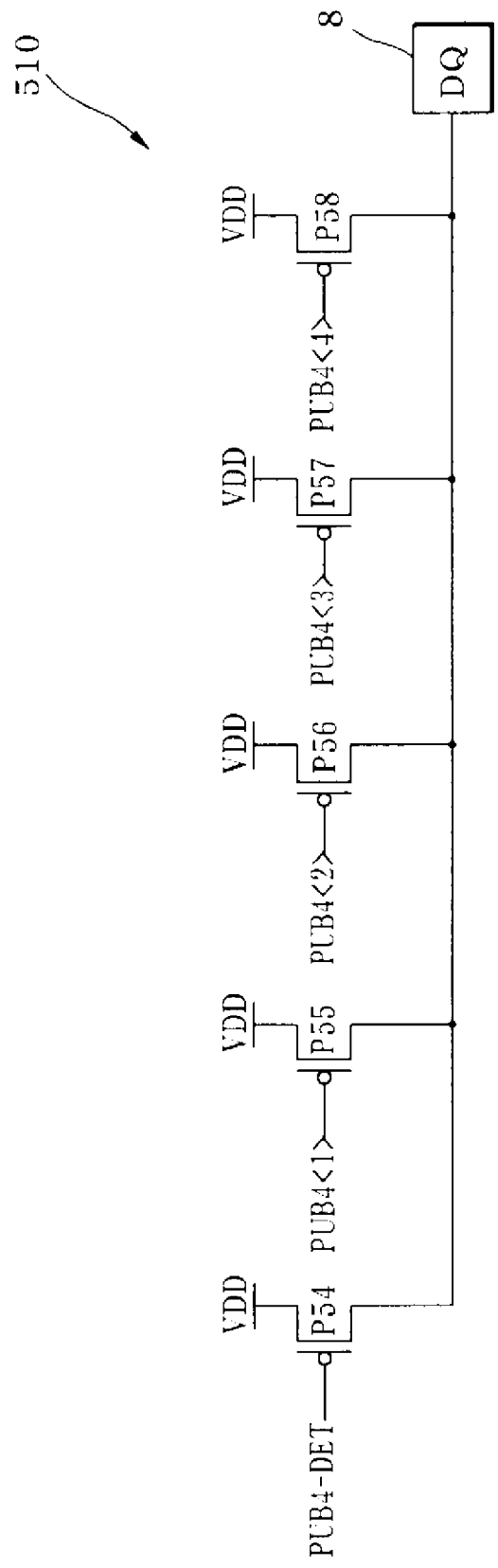
FIG. 9 is a circuit diagram of a pull-up driving unit included in the pull-up driver circuit of FIG. 6.

As illustrated in FIG. 9, the first pull-up driving unit 510 of the fourth group includes PMOS transistors P54, P55, P57, P58. The PMOS transistor P54 is configured to be turned on in response to the first pull-up driving selection signal PUB4_DET and pull up the data pad 8. The PMOS transistors P55, P56, P57, P58 are configured to be turned on in response to the first to fourth pull-up driving signals PUB4<1:4> of the fourth group and pull up the data pad 8. The configurations of the second to fourth pull-up driving units 511, 512, 513 of the fourth group, the first and second pull-up driving units 610 and 611 of the fifth group, and the pull-up driving unit 71 of the sixth group are substantially identical to that of the first pull-up driving unit 510 of the fourth group.

The pull-up driver circuit included in the output driver circuit according to an embodiment of the present invention has a structural feature in that the first to fourth pull-up codes PCALB<1:4> generated from the ZQ calibration circuit are input to the fourth pre-driver unit 50, the fifth pre-driver unit 60, and the sixth pre-driver unit 70. Therefore, as illustrated in FIG. 9, the first to fourth pull-up driving units 510, 511, 512, 513 of the fourth group, the first and second pull-up driving units 610 and 611 of the fifth group, and the pull-up driving unit 71 of the sixth group are implemented with single MOS transistors which are not coupled in series, thereby reducing the circuit area and current consumption. Furthermore, the pull-up driver circuit included in the output driver circuit is provided with groups including pull-up driving units which share the plurality of pre-drivers, thereby reducing the circuit area.

The driving strength of the output driver circuit configured as above is determined by the first to third group selection signals RONB<1:3>, the first to fourth pull-down codes NCALB<1:4>, and the first to fourth pull-up codes PCALB<1:4>. The first to third group selection signals RONB<1:3> determine whether to drive the first to third group pull-down blocks 2, 3, 4 and the fourth to sixth group pull-up blocks 5, 6, 7. For example, when the first group selection signal RONB<1> having a low level is input, the first group pull-down block 2 and the first group pull-up block 5 are driven. When the second group selection signal RONB<2> having a low level is input, the second group pull-down block 3 and the second group pull-up block 6 are driven. When the third group selection signal RONB<3> having a low level is input, the third group pull-down block 3 and the third group pull-up block 7 are driven. The pre-drivers included in the group pull-down blocks 2, 3, 4 are controlled by the first to fourth pull-down codes NCALB<1:4>. The pre-drivers included in the group pull-up blocks 5, 6, 7 are controlled by the first to fourth pull-up codes PCALB<1:4>.

The operation of the output driver circuit will now be described based on the assumption that the second group selection signal RONB<2> of the first to third group selection signals RONB<1:3> is at a low level, the first pull-down code NCALB<1> of the first to fourth pull-down codes NCALB<1:4> is at a low level, and the first pull-up code PCALB<1> of the first to fourth pull-up codes PCALB<1:4> is at a low level.

First, the second group pull-down block 3 and the second group pull-up block 6 are driven by the second group selection signal RONB<2> which is enabled to a low level. More specifically, the pre-driver 300 included in the second group pull-down block 3 buffers the pre-pull-down driving signal PDB and generates the second pull-down driving selection signal PD2_DET in response to the second group selection signal RONB<2> which is enabled to a low level. The pre-driver 600 included in the second group pull-up block 6 buffers the pre-pull-up driving signal PU and generates the second pull-up driving selection signal PUB2_DET in response to the second group selection signal RONB<2> which is enabled to a low level.

Next, the pre-driver 301 included in the second group pull-down block 3 buffers the pre-pull-down driving signal PDB and generates the first pull-down driving signal PD2<1> of the second group in response to the first pull-down code NCALB<1> and the second group selection signal RONB<2> which are enabled to a low level. Also, the pre-driver 601 included in the second group pull-up block 6 buffers the pre-pull-up driving signal PU and generates the first pull-up driving signal PUB2<1> of the fifth group in response to the first pull-up code PCALB<1> and the second group selection signal RONB<2> which are enabled to a low level. The first pull-down driving signal PD2<1> is enabled to a high level when data stored in a memory cell has a low level in a read operation. The first pull-up driving signal PUB2<1> is enabled to a low level when data stored in a memory cell has a high level in a read operation.

Next, the first and second pull-down driving units 310 and 311 of the second group included in the second group pull-down block 3 receive the second pull-down driving selection signal PD2_DET and the first pull-down driving signal PD2<1> and pull down the data pad 8. The first and second pull-up driving units 610 and 611 of the fifth group included in the second group pull-up block 6 receive the second pull-up driving selection signal PUB2_DET and the first pull-up driving signal PUB2<1> and pull up the data pad 8.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An output driver circuit comprising:
   a pre-driver unit configured to generate a driving selection signal and a driving signal from a pre-driving signal in response to a group selection signal and a code signal; and
   a first driving unit configured to drive a data pad in response to the driving selection signal and the driving signal.

2. The output driver circuit of claim 1, wherein the pre-driver unit comprises:
   a first pre-driver configured to buffer the pre-driving signal and generate the driving selection signal in response to the group selection signal; and
   a second pre-driver configured to buffer the pre-driving signal and generate the driving signal in response to the group selection signal and the code signal.

3. The output driver circuit of claim 2, wherein the first pre-driver comprises:
   a buffer configured to buffer the pre-driving signal; and
   a driving controller configured to control the buffer in response to the group selection signal.

4. The output driver circuit of claim 2, wherein the second pre-driver comprises:
   a buffer configured to buffer the pre-driving signal; and
   a driving controller configured to control the buffer in response to the group selection signal and the code signal.

5. The output driver circuit of claim 1, wherein the first driving unit comprises:
   a first driving element configured to drive the data pad in response to the driving selection signal; and
   a second driving element configured to drive the data pad in response to the driving signal.

6. The output driver circuit of claim 1, further comprising a second driving unit configured to drive the data pad in response to the driving selection signal and the driving signal.

7. The output driver circuit of claim 6, wherein the second driving unit comprises:
   a first driving element configured to drive the data pad in response to the driving selection signal; and
   a second driving element configured to drive the data pad in response to the driving signal.

8. An output driver circuit comprising:
   a first pre-driver configured to generate a driving selection signal from a pre-driving signal in response to a group selection signal;
   a second pre-driver configured to generate a first driving signal of a first group from the pre-driving signal in response to the group selection signal and a first code signal;
   a third pre-driver configured to generate a second driving signal of the first group from the pre-driving signal in response to the group selection signal and a second code signal; and
   a driving unit configured to drive a data pad in response to the driving selection signal, the first driving signal of the first group, and the second driving signal of the first group.

9. The output driver circuit of claim 8, wherein the first pre-driver comprises:
   a buffer configured to buffer the pre-driving signal; and
   a driving controller configured to control the buffer in response to the group selection signal.

10. The output driver circuit of claim 8, wherein the second pre-driver comprises:
    a buffer configured to buffer the pre-driving signal; and
    a driving controller configured to control the buffer in response to the group selection signal and the first code signal.

11. The output driver circuit of claim 8, wherein the third pre-driver comprises:
    a buffer configured to buffer the pre-driving signal; and
    a driving controller configured to control the buffer in response to the group selection signal and the second code signal.

12. The output driver circuit of claim 8, wherein the driving unit comprises:
    a first driving element configured to drive the data pad in response to the driving selection signal;
    a second driving element configured to drive the data pad in response to the first driving signal of the first group; and
    a third driving element configured to drive the data pad in response to the second driving signal of the first group.

13. An output driver circuit comprising:
    a first pre-driver unit configured to generate a first driving selection signal and a first driving signal of a first group from a pre-driving signal in response to a first group selection signal and a first code signal;
    first and second driving units configured to drive a data pad in response to the first driving selection signal and the first driving signal of the first group;
    a second pre-driver unit configured to generate a second driving selection signal and first and second driving signals of a second group from the pre-driving signal in response to a second group selection signal, the first code signal, and a second code signal; and
    a third driving unit configured to drive the data pad in response to the first driving selection signal and the first and second driving signal of the second group.

14. The output driver circuit of claim 13, wherein the first pre-driver unit comprises:
    a first pre-driver configured to buffer the pre-driving signal and generate the first driving selection signal in response to the first group selection signal; and
    a second pre-driver configured to buffer the pre-driving signal and generate the first driving signal of the first group in response to the first group selection signal and the first code signal.

15. The output driver circuit of claim 14, wherein the first pre-driver comprises:
    a buffer configured to buffer the pre-driving signal; and
    a driving controller configured to control the buffer in response to the first group selection signal.

16. The output driver circuit of claim 14, wherein the second pre-driver comprises:
    a buffer configured to buffer the pre-driving signal; and
    a driving controller configured to control the buffer in response to the first group selection signal and the first code signal.

17. The output driver circuit of claim 13, wherein each of the first and second driving units comprises:

a first driving element configured to drive the data pad in response to the first driving selection signal; and a second driving element configured to drive the data pad in response to the first driving signal of the first group.

18. The output driver circuit of claim 13, wherein the second pre-driver unit comprises:
   a first pre-driver configured to generate the second driving selection signal from the pre-driving signal in response to the second group selection signal;
   a second pre-driver configured to generate the first driving signal of the second group from the pre-driving signal in response to the second group selection signal and the first code signal; and
   a third pre-driver configured to generate the second driving signal of the second group from the pre-driving signal in response to the second group selection signal and the second code signal.

19. The output driver circuit of claim 18, wherein the first pre-driver comprises:
   a buffer configured to buffer the pre-driving signal; and
   a driving controller configured to control the buffer in response to the second group selection signal.

20. The output driver circuit of claim 18, wherein the second pre-driver comprises:
   a buffer configured to buffer the pre-driving signal; and
   a driving controller configured to control the buffer in response to the second group selection signal and the first code signal.

21. The output driver circuit of claim 18, wherein the third pre-driver comprises:
   a buffer configured to buffer the pre-driving signal; and
   a driving controller configured to control the buffer in response to the group selection signal and the second code signal.

22. The output driver circuit of claim 13, wherein the third driving unit comprises:
   a first driving element configured to drive the data pad in response to the second driving selection signal;
   a second driving element configured to drive the data pad in response to the first driving signal of the second group; and
   a third driving element configured to drive the data pad in response to the second driving signal of the second group.

* * * * *